United States Patent
Doyle et al.

(10) Patent No.: US 12,207,392 B2
(45) Date of Patent: Jan. 21, 2025

(54) ELECTRONIC COMPONENT COMPRISING FIRST AND SECOND CONDUCTIVE TRACES AND A VOID FORMED IN AN INSULATIVE LAYER BETWEEN THE FIRST AND SECOND TRACES PROVIDING CROSSTALK REDUCTION

(71) Applicant: International Business Machines Corporation, Armonk, NY (US)

(72) Inventors: Matthew Doyle, Chatfield, MN (US); David Clifford Long, Wappingers Falls, NY (US); Matteo Cocchini, New York, NY (US); Russell A. Budd, North Salem, NY (US); James Busby, New Paltz, NY (US); Roger S. Krabbenhoft, Rochester, MN (US); Arthur J. Higby, Cottekill, NY (US)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 17/933,693

(22) Filed: Sep. 20, 2022

(65) Prior Publication Data
US 2024/0098882 A1 Mar. 21, 2024

(51) Int. Cl.
*H05K 1/02* (2006.01)
*H01P 3/08* (2006.01)
*H01P 11/00* (2006.01)

(52) U.S. Cl.
CPC .......... *H05K 1/0228* (2013.01); *H01P 3/081* (2013.01); *H01P 11/003* (2013.01)

(58) Field of Classification Search
CPC .. H01P 3/082; H01P 3/088; H01P 3/04; H01P 3/02; H01P 3/026; H01P 11/003; H05K 1/0228
(Continued)

(56) References Cited

U.S. PATENT DOCUMENTS 5,426,399 A * 6/1995 Matsubayashi et al. ..................... H01B 7/0861
174/117 FF
6,441,470 B1 8/2002 Shenoy
(Continued)

FOREIGN PATENT DOCUMENTS

EP 1549118 A3 7/2007

OTHER PUBLICATIONS

Carlsson, J., "Crosstalk on printed circuit boards", https://www.researchgate.net/publication/242077443_Crosstalk_on_printed_circuit_boards, Jan. 1994, 50 pgs.
(Continued)

*Primary Examiner* — Benny T Lee
(74) *Attorney, Agent, or Firm* — James L. Olsen

(57) ABSTRACT

An electronic component includes a first trace configured to transmit a first signal and a second trace configured to transmit a second signal. The electronic component further includes a layer of conductive material separated from the first and second traces by a layer of insulative material. The electronic component further includes a first vertical wall formed in direct contact with the layer of conductive material. The electronic component further includes a second vertical wall formed in direct contact with the layer of conductive material. The second vertical wall is separated from the first vertical wall by a void, and the void extends between the first trace and the second trace.

20 Claims, 6 Drawing Sheets

(58) Field of Classification Search
USPC .............................................. 333/1
See application file for complete search history.

(56) References Cited

U.S. PATENT DOCUMENTS

| | | |
|---|---|---|
| 6,444,922 B1 | 9/2002 | Kwong |
| 7,530,167 B2 | 5/2009 | Lauffer et al. |
| 7,659,790 B2 * | 2/2010 | Shaul et al. ............ H01P 3/003 |
| | | 333/1 |
| 7,676,919 B2 | 3/2010 | Zhao et al. |
| 7,911,288 B1 | 3/2011 | Bokhari |
| 9,041,205 B2 | 5/2015 | Karhade et al. |
| 9,935,353 B2 * | 4/2018 | Ouyang et al. ....... H01P 11/003 |
| 10,103,054 B2 | 10/2018 | Zhang et al. |
| 2005/0057326 A1 | 3/2005 | Kuzmenka |
| 2006/0288570 A1 * | 12/2006 | Cannon et al. ........ H05K 1/024 |
| | | 174/250 |

OTHER PUBLICATIONS

Gatchev et al., "Influence of the Milling Depth on the Microstrip Parameters in Milled PCB-Plates for Microwave Applications," 14th International Conference on Microwaves, Radar and Wireless Communications. MIKON-2002. Conference Proceedings (IEEE Cat. No. 02EX562). vol. 2. IEEE, 2002.
Maloratsky, L., "Using modified microstrip lines to improve circuit performance," High Frequency Electronics 10.5 (2011): 36-52.

\* cited by examiner

ELECTRONIC COMPONENT COMPRISING FIRST AND SECOND CONDUCTIVE TRACES AND A VOID FORMED IN AN INSULATIVE LAYER BETWEEN THE FIRST AND SECOND TRACES PROVIDING CROSSTALK REDUCTION

BACKGROUND

The present disclosure relates to the electrical, electronic, and computer fields. In particular, the present disclosure relates to electronic components commonly assembled in electronic devices.

A printed circuit board (PCB) is a laminated sandwich structure of conductive and insulating layers. PCBs have two complementary functions. The first is to affix electronic components in designated locations on the outer layers by means of soldering. The second is to provide reliable electrical connections (and also reliable open circuits) between the component's terminals in a controlled manner. Each of the conductive layers is designed with a pattern of conductors (similar to wires on a flat surface) that provides electrical connections on that conductive layer.

SUMMARY OF THE INVENTION

Embodiments of the present disclosure include an electronic component. The electronic component includes a first trace configured to transmit a first signal. The electronic component further includes a second trace configured to transmit a second signal. The electronic component further includes a layer of conductive material separated from the first and second traces by a layer of insulative material. The electronic component further includes a first vertical wall formed in direct contact with the layer of conductive material. The electronic component further includes a second vertical wall formed in direct contact with the layer of conductive material. The second vertical wall is separated from the first vertical wall by a void, and the void extends between the first trace and the second trace.

Additional embodiments of the present disclosure include an electronic component. The electronic component includes a first insulative layer arranged in direct contact with a first conductive layer. The electronic component further includes a first trace configured to transmit a first signal and a second trace configured to transmit a second signal. The first and second traces are separated from the first conductive layer by the first insulative layer. The electronic component further includes first and second vertical walls extending from a surface of the first conductive layer and in direct contact with the first insulative layer. The first and second vertical walls separated from one another by a first void. The electronic component further includes a second insulative layer separated from the first insulated layer and from the first and second traces by a dielectric layer. The electronic component further includes a second conductive layer in direct contact with the second insulative layer. The electronic component further includes third and fourth vertical walls extending from a surface of the second conductive layer and in direct contact with the second insulative layer. The third and fourth vertical walls are separated from one another by a second void.

Additional embodiments of the present disclosure include a method for making an electronic component. The method includes forming a first trench and a second trench in a circuit board such that the first trench and the second trench are arranged between a first trace and a second trace of the circuit board. The method further includes partially filling each of the first and second trenches with conductive material to form a first vertical wall and a second vertical wall in direct contact with an uppermost surface of a conductive layer of the circuit board. The method further includes forming a first void between the first vertical wall and the second vertical wall so as to expose the uppermost surface the conductive layer between the first and second vertical walls.

The above summary is not intended to describe each illustrated embodiment or every implementation of the present disclosure.

BRIEF DESCRIPTION OF THE DRAWINGS

The drawings included in the present disclosure are incorporated into, and form part of, the specification. The drawings illustrate embodiments of the present disclosure and, along with the description, serve to explain the principles of the disclosure. The drawings are only illustrative of typical embodiments and do not limit the disclosure.

DETAILED DESCRIPTION OF THE INVENTION

Figure 1:
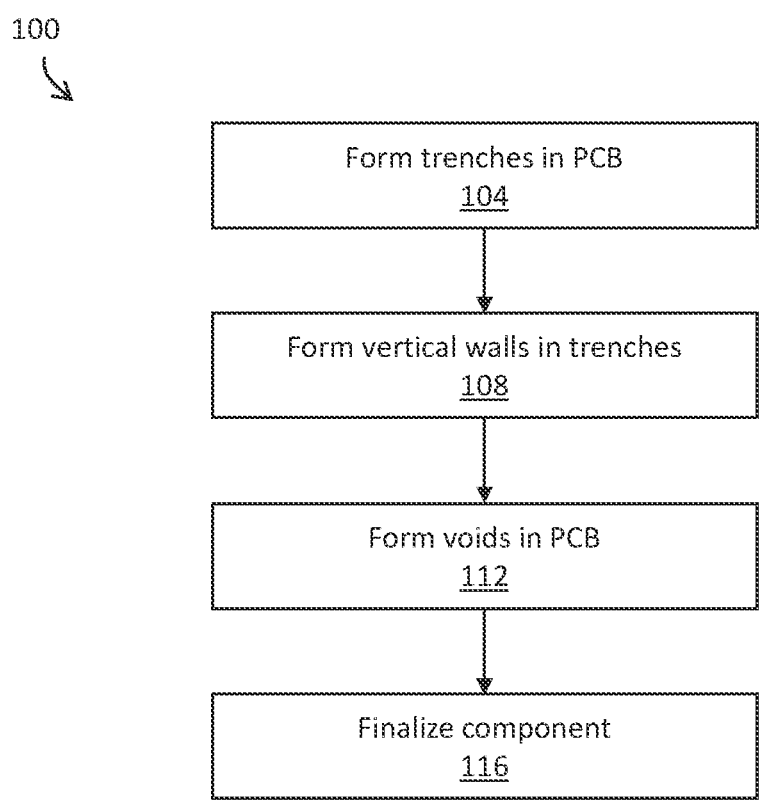
FIG. 1 illustrates a flowchart of an example method for forming an electronic component, in accordance with embodiments of the present disclosure.

Aspects of the present disclosure relate generally to the electrical, electronic, and computer fields. In particular, the present disclosure relates to electronic components commonly assembled in electronic devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, as mentioned above, a printed circuit board (PCB) is a laminated sandwich structure of conductive and insulating layers and are configured to affix electronic components in designated locations on the outer layers and to provide reliable electrical connections between the component's terminals in a controlled manner. Each of the conductive layers is designed with a pattern of conductors (similar to wires on a flat surface) that provides electrical connections on that conductive layer. The conductors may also be referred to herein as "traces." Conductors and conductive layers may be made of a variety of conductive materials, but copper is most commonly used. Accordingly, references herein to copper as a conductive material can also be more generally applied to other conductive materials used for conductors and conductive layers.

PCB manufacturing comprises many steps. Copper patterning includes forming a particular pattern of traces on an insulative surface or layer to form a given conductive layer. Copper patterning may include the performance of subtractive, additive, and/or semi-additive processes. Subtractive methods include the removal of copper from an entirely copper-coated board to leave only the desired copper pattern. In additive methods, the pattern is electroplated onto a bare substrate using a complex process. Semi-additive methods are commonly used for multi-layer boards as semi-additive methods facilitate plating through-holes to produce conductive vias in the circuit board. Semi-additive methods may include applying a reverse mask onto a thin layer of copper of an unpatterned board. Unlike in the subtractive process, the reverse mask exposes those parts of the substrate that will eventually become the traces. Additional copper is then plated onto the board in the unmasked areas. Following additional selective surface plating, an etching process then removes exposed bare original copper laminate from the board, isolating the individual traces.

Notably, the discussion and embodiments described herein apply to flexible circuit structures in the same manner as applied to rigid PCBs. Accordingly, as used herein, the term "PCBs" can refer to and include various printed mediums such as traditional PCBs and flexible circuit structures.

Each trace consists of a flat, narrow part of copper formed by copper patterning. Its resistance, determined by its width, thickness, and length, must be sufficiently low for the current the conductor will carry. Power and ground traces may need to be wider than signal traces. In a multi-layer board, one entire layer may be mostly solid copper to act as a ground plane for shielding and power return. For microwave circuits, transmission lines can be laid out in a planar form such as stripline or microstrip with carefully controlled dimensions to assure a consistent impedance. In radio-frequency and fast switching circuits, the inductance and capacitance of the PCB conductors become significant circuit elements, usually undesired. Conversely, they can be used as a deliberate part of the circuit design, as in distributed-element filters, antennae, and fuses, obviating the need for additional discrete components.

A serializer/deserializer (SerDes) is a functional block used to transmit high speed input/output (IO) data over a serial link in IO interfaces at high speeds such as, for example 2.5 Gbps. In essence, a SerDes is a serial transceiver which converts parallel data into a serial data stream on the transmitter side and converts the serial data back to parallel on the receiver side. High speed SerDes (HSS) links are extremely sensitive to attenuation and crosstalk.

More specifically, as used herein, attenuation refers to the reduction of the amplitude of a signal or current due to unintentional propagation of some of the electromagnetic energy to adjacent parallel traces. As used herein, crosstalk refers to electromagnetic interference on traces that is inadvertently and undesirably received from signals that are sent along adjacent parallel traces. Accordingly, in HSS links, both sources and receptors are susceptible to negative impacts due to unintentional propagation and reception of electromagnetic energy on adjacent parallel traces. These issues are further exacerbated by HSS data rates that continue to increase to Gen5 and beyond. Additionally, increasing package density also exacerbates signal attenuation and crosstalk implications.

Some strategies for reducing attenuation and crosstalk within PCBs include grounding or shielding, which aim to reduce emissions or to divert electromagnetic energy away from a receptor by providing an alternative, low impedance path. However, such strategies typically require the use of high-cost materials and/or substantial manufacturing and design efforts.

Embodiments of the present disclosure may enable the reduction of attenuation and crosstalk without requiring specialized high-cost materials. Such embodiments may enable substantial signaling benefits in all electronic applications utilizing HSS channels, in all applications where crosstalk is of great concern (e.g., IBM Quantum), and in all applications having high IO density and/or in which electrical and optical IO coexist.

FIG. 1 depicts a flowchart of an example method 100 for forming an electronic component, in accordance with embodiments of the present disclosure. As discussed in further detail below, the performance of method 100 includes forming trenches in a PCB, forming vertical walls in the trenches, and forming voids in the PCB.

Prior to the performance of the method 100, an electronic component that has been partially prepared using conventional PCB manufacturing techniques is provided. In particular, the electronic component includes a number of laminated insulative and conductive layers as well as traces formed on top of the uppermost insulative layer and a dielectric layer covering the traces and the uppermost surface of the uppermost insulative layer.

Figure 2:
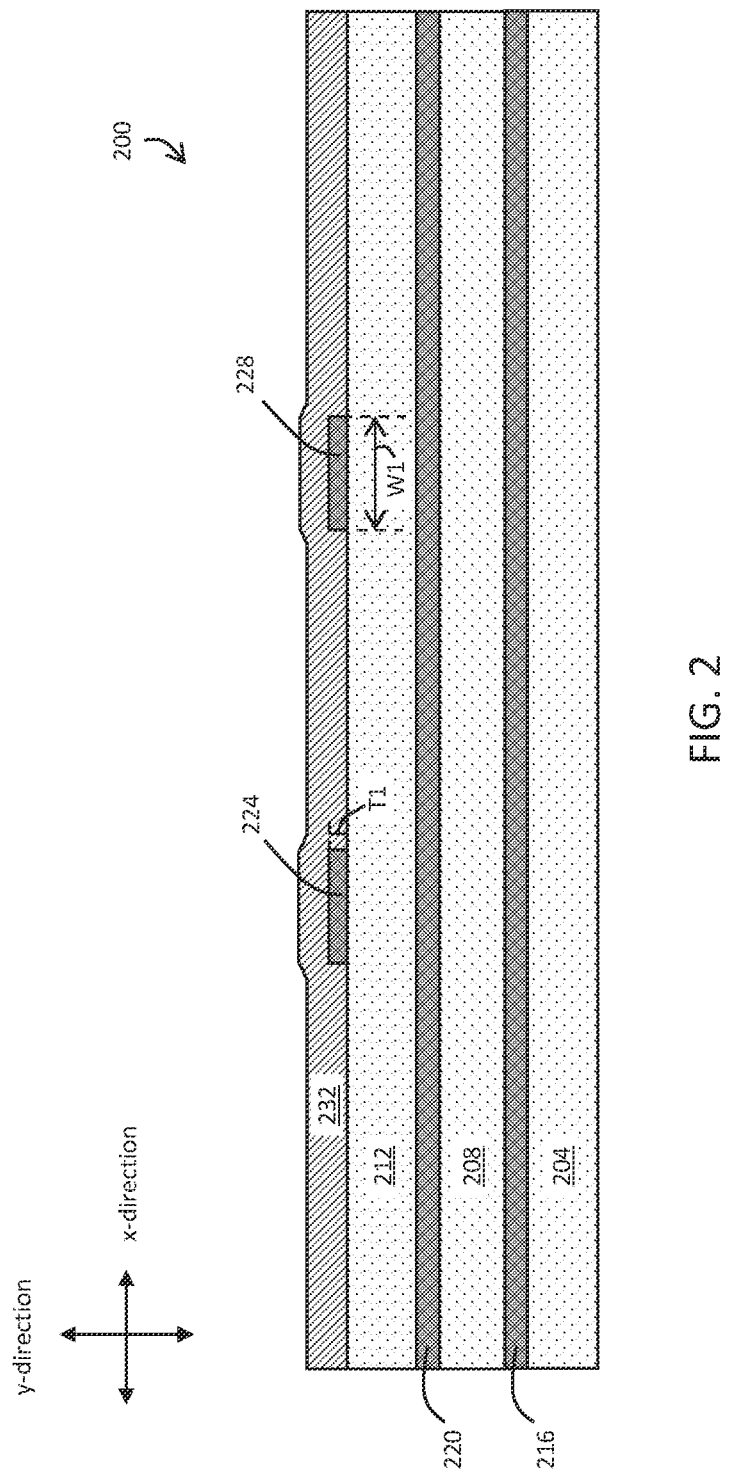
FIG. 2 illustrates a cross-sectional view of an example of an electronic component following the performance of a portion of the example method of FIG. 1, in accordance with embodiments of the present disclosure.

FIG. 2 depicts a cross-sectional view of such an example electronic component 200 prior to the performance of method 100, for illustrative purposes. As shown in FIG. 2, the electronic component 200 is a PCB which includes laminated layers 204, 208, 212 of insulative material arranged in an alternating pattern with laminated layers 216, 220 of conductive material. Notably, the uppermost layer 220 of conductive material provides a ground layer (which may also be referred to as a "ground" or a "ground plane") for the grounding of electrical energy.

The number and relative thicknesses of the laminated layers 204, 206, 208, 212, 216, and 220 shown in FIG. 2 are intended to be illustrative and non-limiting. Accordingly, in alternative embodiments, the electronic component 200 may include more or fewer layers having different thicknesses and relative thicknesses than shown in FIG. 2. Additionally, the electronic component 200 may extend farther in each dimension than is illustrated in FIG. 2.

Traces 224, 228 are formed on top of and in direct contact with the uppermost layer 212 of insulative material. In accordance with at least one embodiment of the present disclosure, the traces 224, 228 are made of copper. Each trace 224, 228 has a width W1 extending horizontally (in the x-direction) across the cross-sectional view shown in FIG. 2. By way of example, the width W1 of each trace 224, 228 can be approximately 8 mils (approximately 0.203 millimeters). Each trace 224, 228 also has a thickness T1 extending vertically (in the y-direction) along the cross-sectional view shown in FIG. 2. By way of example, the thickness T1 of each trace 224, 228 can be approximately 1.2 mils (approximately 0.030 millimeters). Additionally, each trace 224, 228 also has a length extending in a direction into/out of the page in the cross-sectional view shown in FIG. 2. Accordingly, the lengths of the traces 224, 228 are not visible in FIG. 2. The sample dimensions provided above are intended to be non-limiting and illustrative. In alternative embodiments, the dimensions can be different than those presented herein depending on the intended application of the PCB and available manufacturing technologies.

The traces 224, 228 and the uppermost surface of the uppermost layer 212 of insulative material are covered with an additional layer 232 of dielectric material such as, for example, an organic/glass prepreg material. Accordingly, the additional layer 232 is in direct contact with the traces 224, 228.

Returning to FIG. 1, the method 100 begins with operation 104 wherein trenches are formed in a provided PCB. More specifically, operation 104 includes selectively removing material from the provided PCB. Particular portions of the organic/glass prepreg material are removed as well as portions of the uppermost layer of insulative material that are arranged directly beneath those removed portions of the organic/glass prepreg material. These portions of material are removed from between the two traces. As such, the selective removal of the material from the PCB forms trenches between the traces. The specific locations and dimensions of the portions of removed materials and/or the resulting trenches that are formed are illustratively described herein. Notably, however, other specific locations and/or dimensions are possible so long as the desired resulting reduction in attenuation and crosstalk between the traces is achieved.

Each trench extends vertically (in the y-direction) through the uppermost layer of insulative material and the layer of organic/glass prepreg material and stops at the uppermost surface of the uppermost layer of conductive material. The distance from the uppermost surface of the uppermost layer of conductive material to the uppermost surface of the layer of organic/glass prepreg material is the depth of the trench.

Each trench also extends horizontally (in the x-direction, as shown in FIG. 2) from a first wall, formed nearest to the nearest trace, to a second wall, formed farthest from the nearest trace. The distance between the first wall and the second wall is the width of the trench. In accordance with at least one illustrative embodiment of the present disclosure, the width of each trench can be, for example, 3 mils.

The location of each trench is separated horizontally (in the x-direction) from the nearest trace by a width of remaining uppermost layer of insulative material and layer of organic/glass prepreg material. Accordingly, a trench buffer is formed by an amount of the uppermost layer of insulative material and the layer of organic/glass prepreg material that remains between each trace and the first wall of the nearest formed trench. The extent of each trench buffer in the x-direction is the width of the trench buffer. In accordance with at least one illustrative embodiment of the present disclosure, the width of the trench buffers can be, for example, 4 mils.

The trenches are formed such that the trenches are separated horizontally (in the x-direction) from one another by a further width of remaining uppermost layer of insulative material and layer of organic/glass prepreg material. Accordingly, a trench separator is formed by an amount of the uppermost layer of insulative material and the layer of organic/glass prepreg material that remains between the second walls of the trenches. The extent of the trench separator in the x-direction is the width of the trench separator. In accordance with at least one illustrative embodiment of the present disclosure, the width of the trench separator can be, for example, 10 mils.

In accordance with at least one embodiment of the present disclosure, the trenches are formed by using a laser to remove the particular portions of organic/glass prepreg material and insulative material. In such embodiments, the laser parameters are particularly selected to remove the organic/glass prepreg material and the insulative material without damaging or altering the uppermost layer of conductive material. Additionally, use of a laser can enable the precision required to remove material having dimensions and locations such as those discussed above. By way of example, the laser parameters can include a wavelength of approximately 1035 nm wavelength, a pulse width of approximately 300 femtoseconds, a pulse repetition rate of approximately 1 MHz, and an average power of approximately 2 watts.

Figure 3:
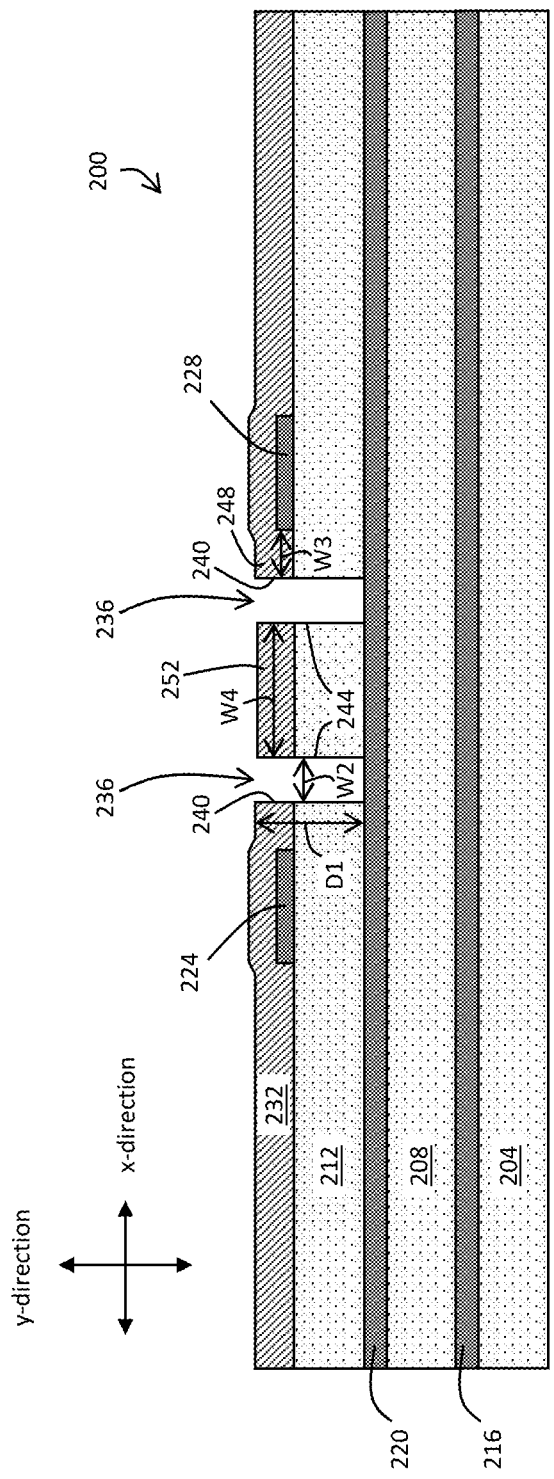
FIG. 3 illustrates a cross-sectional view of an example of an electronic component following the performance of a portion of the example method of FIG. 1, in accordance with embodiments of the present disclosure.

FIG. 3 depicts a cross-sectional view of the electronic component 200 following the performance of operation 104 of FIG. 1. As shown, particular portions of the additional layer 232 of dielectric material as well as portions of the uppermost layer 212 of insulative material that are arranged directly beneath those portions of the additional layer 232 of dielectric material are removed without damaging or altering the uppermost layer 220 of conductive material. Accordingly, the performance of operation 104 forms trenches 236 between the traces 224, 228. As discussed above, each trench 236 extends through the uppermost layer 212 of insulative material and the additional layer 232 of dielectric material and stops at the uppermost surface of the uppermost layer 220 of conductive material.

As discussed above, each trench 236 extends for a depth D1 from the uppermost surface of the uppermost layer 220 of conductive material to the uppermost surface of the additional layer 232 of dielectric material. Each trench 236 also extends between a first wall 240 and a second wall 244 for a width W2. Each trench 236 is separated from the nearest trace 224, 228 by a trench buffer 248, and each trench buffer 248 has a width W3. Additionally, the trenches 236 are separated from each other by a trench separator 252 having a width W4.

Returning to FIG. 1, following the performance of operation 104, the method 100 proceeds with the performance of operation 108, wherein vertical walls are formed in the trenches. More specifically, operation 108 includes plating the trenches to form vertical walls in the uppermost layer of insulative material. Each of the vertical walls is in direct contact with the uppermost layer of conductive material. In accordance with at least one embodiment of the present disclosure, the trenches are plated with the same conducive material as the uppermost layer of conductive material. Accordingly, in such embodiments, the vertical walls are formed of the conductive material and provide vertical extensions of the uppermost layer of conductive material.

Figure 4:
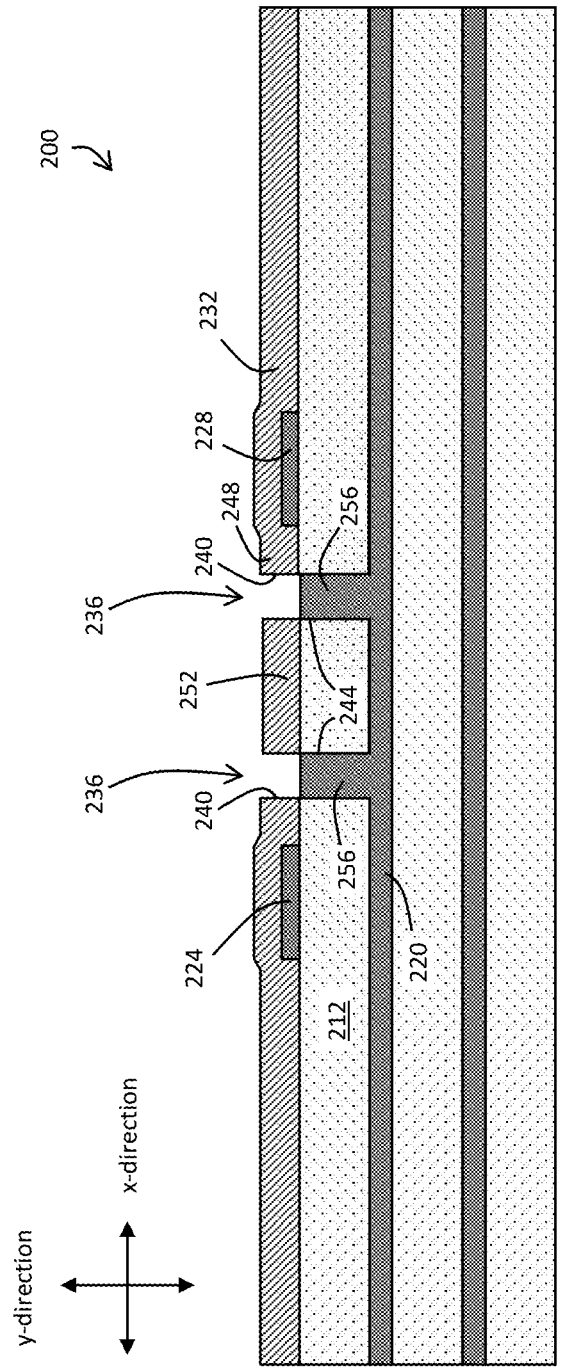
FIG. 4 illustrates a cross-sectional view of an example of an electronic component following the performance of a portion of the example method of FIG. 1, in accordance with embodiments of the present disclosure.

FIG. 4 depicts a cross-sectional view of the electronic component 200 following the performance of operation 108 of FIG. 1. As shown, each of the trenches 236 is plated with conductive material to form a vertical wall 256 in the uppermost layer 212 of insulative material. In other words, the vertical walls 256 extend upwardly from the uppermost surface of the uppermost layer 220 of conductive material to a height that is approximately equal to the height of the uppermost surface of the uppermost layer 212 of insulative material. Accordingly, each of the vertical walls 256 is in direct contact with the uppermost surface of the uppermost layer 220 of conductive material. Additionally, the portions of the trenches 236 that extend through the additional layer 232 of dielectric material remain unfilled. As a result, each of the vertical walls 256 extends for a height that is less than the depth D1 (shown in FIG. 3) of the trench 236 in which it is formed.

Each of the vertical walls 256 is in direct contact with each of the first wall 240 and the second wall 244 of the trench 236 in which it is formed. In other words, each of the vertical walls 256 is in direct contact with the uppermost layer 212 of insulative material. As a result, each of the vertical walls 256 extends for a width that is equal to the width W2 (shown in FIG. 3) of the trench 236 in which it was formed. Like the trenches 236 in which they were formed, the vertical walls 256 are separated horizontally from one another by the trench separator 252 and from the respective nearest trace 224, 228 by a respective trench buffer 248.

Returning to FIG. 1, following the performance of operation 108, the method 100 proceeds with the performance of operation 112, wherein voids are formed in the PCB. More specifically, operation 112 includes selectively removing material from the PCB. As in the performance of operation 104, the performance of operation 112 includes selectively removing particular portions of the organic/glass prepreg material as well as portions of the uppermost layer of insulative material that are arranged directly beneath those removed portions of the organic/glass prepreg material. These portions are removed from between the two vertical walls and from outside each of the traces. The specific locations and dimensions of the portions of removed materials and/or the resulting voids that are formed are illustratively described herein. Notably, however, other specific locations and/or dimensions are possible so long as the desired resulting reduction in attenuation and crosstalk between the traces is achieved.

Like the trenches, each of the voids is formed such that the particular portions of the organic/glass prepreg material and uppermost layer of insulative material are completely removed, but the underlying uppermost layer of conductive material is not damaged or altered. Accordingly, like the trenches, the depth of each of the voids extends from the uppermost surface of the uppermost layer of conductive material to the uppermost surface of the layer of organic/glass prepreg material. Like the trenches, the voids can be formed using a laser operating with particular parameters that are appropriate to achieve these results.

A first void is formed by the removal of the portions of organic/glass prepreg material and uppermost layer of insulative material that form the trench separator. In other words, the first void is formed by the removal of the trench separator. Accordingly, the first void exposes surfaces of the vertical walls as well as the uppermost layer of conductive material between the vertical walls. The dimensions of the first void are equal to those of the trench separator that was removed. Thus, in accordance with at least one illustrative embodiment of the present disclosure, the width of the first void can be, for example, 10 mils.

Second and third voids are formed by the removal of portions of organic/glass prepreg material and uppermost layer of insulative material that are on the opposite sides of the traces than the vertical walls. In other words, the second and third voids are formed such that the traces, the vertical walls, and the first void are arranged horizontally between the second void and the third void.

Each of the second and third voids extends horizontally from a first wall, formed nearest to the nearest trace, to a second wall, formed farthest from the nearest trace. The distance between the first wall and the second wall is the width of each of the second and third voids. In accordance with at least one illustrative embodiment of the present disclosure, each of the second and third voids has dimensions that are approximately equal to those of the first void. Accordingly, in such embodiments, the width of each of the second and third voids can be, for example, 10 mils.

The particular location of each of the second and third voids is separated horizontally from the nearest trace by a width of remaining uppermost layer of insulative material and layer of organic/glass prepreg material. Accordingly, a void buffer is formed by an amount of the uppermost layer of insulative material and the layer of organic/glass prepreg material that remains between each trace and the first wall of the nearest of the second and third voids, respectively. The extent of each void buffer in the x-direction is the width of the void buffer. In accordance with at least one embodiment of the present disclosure, the width of the void buffers is approximately equal to the width of the trench buffers. Accordingly, in such embodiments, the width of the trench buffers can be, for example, 4 mils.

Figure 5:
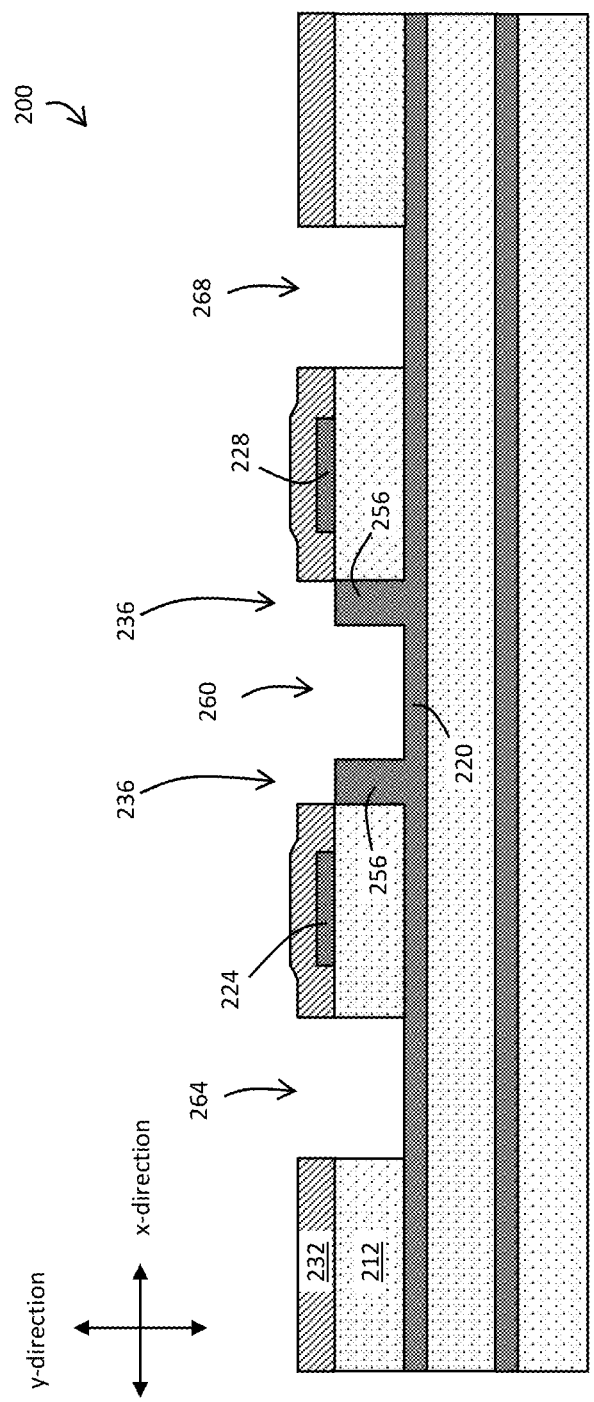
FIG. 5 illustrates a cross-sectional view of an example of an electronic component following the performance of a portion of the example method of FIG. 1, in accordance with embodiments of the present disclosure.

FIG. 5 depicts a cross-sectional view of the electronic component 200 following the performance of operation 112 of FIG. 1. As shown, a first void 260 is formed by the removal of the trench separator 252 (shown in FIG. 4). In other words, the first void 260 is formed by the removal of all material from between the trenches 236 and from between the vertical walls 256. Accordingly, the first void 260 exposes the inwardly facing surfaces of the vertical walls 256 as well as the uppermost surface of the uppermost layer 220 of conductive material between the vertical walls 256.

As further illustrated in FIG. 5, a second void 264 and a third void 268 are formed by the removal of the uppermost layer 212 of insulative material and the additional layer 232 of dielectric material on opposite sides of the traces 224, 228 than the vertical walls 256. Accordingly, when viewed from left to right, FIG. 5 depicts the second void 264, the trace 224, a first vertical wall 256, the first void 260, a second vertical wall 256, the trace 228, and the third void 268. Like the first void 260, the second and third voids 264, 268 expose the uppermost surface of the uppermost layer 220 of conductive material.

The illustrative electronic component 200 shown in FIG. 5, following the performance of operations 104, 108, and 112 of method 100 (shown in FIG. 1), is configured to reduce attenuation and crosstalk between the traces 224, 228 and is ready for use in an electronic device. In particular, electromagnetic energy emitted by either of the traces 224, 228 is generally arranged along predictable electromagnetic field lines emanating from the traces 224, 228. By interrupting the electromagnetic energy arranged along such a field line generated by one trace prior to that electromagnetic energy reaching the other trace can reduce attenuation and crosstalk between the traces.

In the embodiment depicted by FIG. 5, electromagnetic energy generated by the traces 224, 228 is partially dispersed by the voids 260, 264, 268 before reaching any other structure. Furthermore, an amount of the partially dispersed electromagnetic energy is then attracted to the exposed conductive material of the vertical walls 256 and/or the uppermost surface of the uppermost layer 220 of conductive material. The conductive material of the vertical walls 256 and the uppermost layer 220 provide an alternative, low-impedance path, thereby diverting the amount of the partially dispersed electromagnetic energy away from the other trace. As a result, the electronic component 200 reduces attenuation and crosstalk between the traces 224, 228.

Returning to FIG. 1, following the performance of operation 112, the method 100 proceeds with the performance of operation 116, wherein the electronic component is finalized. In accordance with at least one embodiment of the present disclosure, the performance of operation 116 can include the performance of at least one sub-operation.

In accordance with at least one embodiment of the present disclosure, the performance of operation 116 includes integrating the electronic component into an electronic device using known methods and processes.

In accordance with at least one embodiment of the present disclosure, the performance of operation 116 includes coupling the electronic component to another similarly formed electronic component to generate a sandwiched electronic component configured to enable further reduction of attenuation and/or crosstalk between adjacent traces. More specifically, in such embodiments, a second electronic component includes alternating laminated layers of insulative material and conductive material substantially similar to those described above with respect to the electronic component 200 (shown in FIGS. 2-5). The second electronic component also includes second vertical walls substantially similar to those described above with respect to the electronic component 200. The second electronic component also includes voids substantially similar to those described above with respect to the electronic component 200.

Notably, however, the second electronic component does not include traces formed on the uppermost surface of the uppermost layer of insulative material or a further layer of organic/glass prepreg material covering the component. Accordingly, the second electronic component is formed in a manner substantially similar to the electronic component 200 except that the formation of the trenches and voids includes removal of only the uppermost layer of insulative material as there is no further layer of organic/glass prepreg material to be removed.

Figure 6:
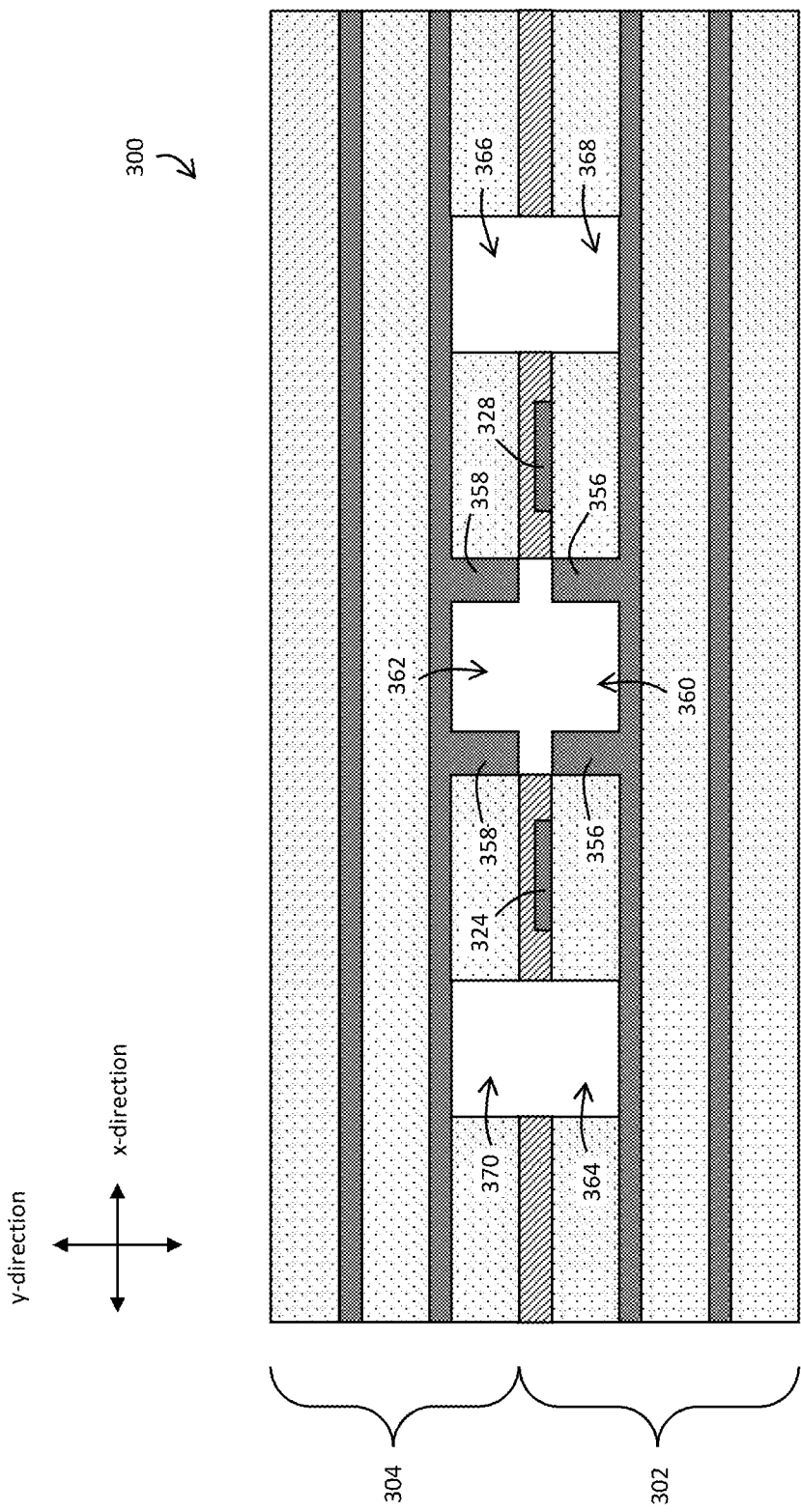
FIG. 6 illustrates a cross-sectional view of an example of an electronic component following the performance of a portion of the example method of FIG. 1, in accordance with embodiments of the present disclosure.

Such embodiments of the present disclosure further include flipping the second electronic component vertically (over an axis parallel to the x-direction as shown in FIG. 6) and arranging the flipped second electronic component on top of the electronic component such that the second vertical walls of the second electronic component are aligned directly above the vertical walls of the electronic component. The second electronic component is then bonded to the electronic component to form a sandwiched electronic component.

FIG. 6 depicts a cross-sectional view of a sandwiched electronic component 300 following the performance of operation 116 of FIG. 1 in the latter embodiment described above. As shown, the sandwiched electronic component 300 includes a first electronic component 302 (which is substantially similar to the electronic component 200 of FIG. 5) and a second electronic component 304 that has been flipped and bonded to the first electronic component 302.

As shown, the second electronic component 304 is arranged relative to the first electronic component 302 such that second vertical walls 358 of the second electronic component 304 are aligned directly above the vertical walls 356 of the first electronic component 302. Accordingly, the first void 362 of the second electronic component 304 is aligned directly above the first void 360 of the first electronic component 302, the second void 366 of the second electronic component 304 is aligned directly above the third void 368 of the first electronic component 302, and the third void 370 of the second electronic component 304 is aligned directly above the second void 364 of the first electronic component 302. As a result, the first void 362 is continuous with the first void 360, the second void 366 is continuous with the third void 368, and the third void 370 is continuous with the second void 364. As used herein, the term continuous refers to features that are formed as an unbroken whole, without interruption.

Notably, the second vertical walls 358 are not in direct contact with the vertical walls 356. The separation between the aligned vertical walls is due to the discrepancy between the depth D1 (shown in FIG. 3) of the trenches relative to the height of the vertical walls 356 formed therein. This separation prevents shorting between the first electronic component 302 and the second electronic component 304.

By increasing the void space relative to the electronic component 200 (shown in FIG. 5), the sandwiched electronic component 300 is able to facilitate further dispersal of electromagnetic energy generated by the traces 324, 328 relative to the electronic component 200. Additionally, by increasing the surface of conductive material relative to the electronic component 200, the sandwiched electronic component 300 is able to facilitate further diversion of the partially dispersed electromagnetic energy relative to the electronic component 200. Accordingly, the sandwiched electronic component 300 further reduces attenuation and crosstalk between the traces 324, 328.

Notably, the stacked voids 364 and 370, 360 and 362, and 368 and 366 provide spaces that are able to accommodate additional components that may be useful or necessary for the electronic device in which the sandwiched electronic component 300 is included. For example, the stacked voids may be configured to accommodate non-electrical components, such as optical components.

Additionally, while the stacked voids formed by 364 and 370 and by 368 and 366 do not include vertical walls, they still facilitate dispersal of electromagnetic energy generated by the traces 324, 328 and still provide spaces that are able to accommodate additional components.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements throughout the detailed description of the drawings), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. An electronic component, comprising:
a first trace configured to transmit a first signal;
a second trace configured to transmit a second signal;
a layer of conductive material separated from the first and second traces by a layer of insulative material;
a first vertical wall formed in direct contact with and perpendicular to the layer of conductive material; and
a second vertical wall formed in direct contact with and perpendicular to the layer of conductive material, wherein:
the second vertical wall is separated from the first vertical wall by a void, and the void extends between the first trace and the second trace.

2. The electronic component of claim 1, wherein:
an uppermost surface of the layer of conductive material is exposed by the void.

3. The electronic component of claim 1, wherein:
the layer of conductive material provides an electrical ground.

4. The electronic component of claim 1, wherein:
the first vertical wall is formed in direct contact with the layer of insulative material; and
the second vertical wall is formed in direct contact with the layer of insulative material.

5. The electronic component of claim 1, wherein:
the first trace is in direct contact with the layer of insulative material; and
the second trace is in direct contact with the layer of insulative material.

6. The electronic component of claim 5, wherein:
the first trace is separated from the first vertical wall by the layer of insulative material; and
the second trace is separated from the second vertical wall by the layer of insulative material.

7. The electronic component of claim 1, further comprising:
a layer of dielectric material covering the first trace, the second trace, and an uppermost surface of the layer of insulative material.

8. The electronic component of claim 1, wherein:
the first and second vertical walls are made of a further conductive material; and
the further conductive material is the same conductive material as the layer of conductive material.

9. An electronic component, comprising:
a first insulative layer arranged in direct contact with a first conductive layer;
a first trace configured to transmit a first signal and a second trace configured to transmit a second signal, the first and second traces separated from the first conductive layer by the first insulative layer;
first and second vertical walls extending from a surface of the first conductive layer and in direct contact with the first insulative layer, the first and second vertical walls separated from one another by a first void;
a second insulative layer separated from the first insulated layer and from the first and second traces by a dielectric layer;
a second conductive layer in direct contact with the second insulative layer; and
third and fourth vertical walls extending from a surface of the second conductive layer and in direct contact with the second insulative layer, the third and fourth vertical walls separated from one another by a second void.

10. The electronic component of claim 9, wherein:
the third vertical wall is arranged directly above the first vertical wall and is separated from the first vertical wall; and
the fourth vertical wall is arranged directly above the second vertical and is separated from the second vertical wall.

11. The electronic component of claim 9, wherein:
the first and second voids are continuous with one another.

12. The electronic component of claim 9, wherein:
at least one of the first or second conductive layers provides an electrical ground.

13. The electronic component of claim 9, wherein:
the first and second vertical walls are made of the same material as the first conductive layer; and
the third and fourth vertical walls are made of the same material as the second conductive layer.

14. The electronic component of claim 9, wherein:
the first insulative layer and the second insulative layer are bonded together by the dielectric layer.

15. The electronic component of claim 9, wherein:
the surface of the first conductive layer is exposed by the first void; and
the surface of the second conductive layer is exposed by the second void.

16. A method for making an electronic component, the method comprising:
forming a first trench and a second trench in a circuit board such that the first trench and the second trench are arranged between a first trace and a second trace of the circuit board;
partially filling each of the first and second trenches with conductive material to form a first vertical wall and a second vertical wall in direct contact with an uppermost surface of a conductive layer of the circuit board;
forming a first void between the first vertical wall and the second vertical wall so as to expose the uppermost surface the conductive layer between the first and second vertical walls.

17. The method of claim 16, wherein:
forming the first and second trenches includes forming a first buffer between the first trench and the first trace and forming a second buffer between the second trench and the second trace.

18. The method of claim 16, wherein:
forming the first and second trenches includes exposing the uppermost surface of the conductive layer of the circuit board.

19. The method of claim 16, wherein:
forming the first and second trenches includes removing portions of an insulative layer of the circuit board and removing portions of a dielectric layer of the circuit board.

20. The method of claim 19, wherein:
removing the portions of the insulative layer and the portions of the dielectric layer includes using a laser.

* * * * *